United States Patent [19]

Tauber et al.

[11] Patent Number: 5,691,279
[45] Date of Patent: Nov. 25, 1997

[54] C-AXIS ORIENTED HIGH TEMPERATURE SUPERCONDUCTORS DEPOSITED ONTO NEW COMPOSITIONS OF GARNET

[75] Inventors: Arthur Tauber, Elberon; Steven C. Tidrow, Eatontown, both of N.J.

[73] Assignee: The United States of America as represented by the Secretary of the Army, Washington, D.C.

[21] Appl. No.: 423,173

[22] Filed: Apr. 18, 1995

Related U.S. Application Data

[63] Continuation-in-part of Ser. No. 228,788, Apr. 12, 1994, Pat. No. 5,418,215, which is a continuation-in-part of Ser. No. 83,406, Jun. 22, 1993, abandoned.

[51] Int. Cl.⁶ .................................................. H01L 39/02
[52] U.S. Cl. ..................... 505/239; 505/238; 505/701; 428/689; 428/701; 428/702; 428/930; 423/263
[58] Field of Search ....................... 505/238, 239, 505/701, 702, 703; 428/688, 689, 701, 702, 930; 385/130, 142; 423/263

[56] References Cited

U.S. PATENT DOCUMENTS

| | | | |
|---|---|---|---|
| 3,723,599 | 3/1973 | Brandle, Jr. | 423/263 |
| 3,764,195 | 10/1973 | Blank | 385/130 |
| 4,956,976 | 9/1990 | Kral | 62/51.3 |
| 4,966,885 | 10/1990 | Hebard | 505/702 |
| 5,093,311 | 3/1992 | Shiota | 505/701 |
| 5,106,828 | 4/1992 | Bhargava | 505/734 |
| 5,245,689 | 9/1993 | Gualtieri | 385/142 |
| 5,302,559 | 4/1994 | Mateika | 501/86 |

OTHER PUBLICATIONS

Oishi et al, Appl. Phys Lett. 59(15) Oct. 7, 1991 pp. 1902–1904.

Koinuma et al., Jap Journ. of Appl Phys. vol. 26, No. 5, May 1987, pp. L 763–765.

Geballe, Science vol. 259, Mar. 12, 1993 pp. 1550–1551.

Nakajima et al., Appl. Phys. Lett. 53(15), Oct. 10, 1988 pp. 1437–1439.

R.D. Shannon, Dielectric Polarizabilities of Ions in Oxides and Fluorides, J. Appl. Phys. 73 (1) 1 Jan. 1993, pp. 348–365.

Geller et al., Thermal Expansion of Some Garnets, Mat. Res. Bull. vol. 7, 28 Aug. 72, pp. 1219–1224.

Chan et al, Growth of Superconducting Y–Ba–Cu–O Films On Spinel and Garnet, Appl. Phys. Letter. vol. 63, 22 Nov. 93, pp. 2964–2966.

Oishi et al, Conducting Thin Films, Appl. Phys. Lett. vol. 59 (15), 7 Oct. 91, pp. 1902–1904.

Koinuma et al., Some Problems in the Preparation of Superconducting Oxide Films on Ceramic Substrates, Japanese J. Appl. Phys. 26 (5) 5 May 87, pp. L763–L765.

Gegalle, Paths to Higher Temperature Superconductors, Science 259, 12 Mar. 93 Nakajima et al Interdiffusion and Interfacial Reaction etc, Appl. Phys. Lett. 53 (15), 10 Oct. 88, pp. 1437–1439.

*Primary Examiner*—Marie R. Yamnitzky
*Attorney, Agent, or Firm*—Michael Zelenka

[57] ABSTRACT c-axis oriented high temperature superconductors are deposited onto new compositions of garnets using pulsed laser deposition (PLD) with conditions of 85 mTorr of oxygen partial pressure; a block temperature of 730° C., a substrate surface temperature of 790° C. and a laser fluence of 1 to 2 Joules/cm² at the target, a laser repetition rate of 10 Hz and a target to substrate distance of 7 cm and in which the a and b lattice parameters of the new compositions of garnets exhibit a mismatch of less than 7 percent with the a and b lattice parameters of the HTSC.

1 Claim, No Drawings

C-AXIS ORIENTED HIGH TEMPERATURE SUPERCONDUCTORS DEPOSITED ONTO NEW COMPOSITIONS OF GARNET

CONTINUATION IN PART

This patent application is a continuation-in-part of U.S. patent application Ser. No. 08/228,788 filed Apr. 12, 1994 (now U.S. Pat. No. 5,418,215) now abandoned by Arthur Tauber and Steven C. Tidrow for "c-Axis Oriented High Temperature Superconductors Deposited onto Single Crystals of Gadolinium Gallium Garnet And Method of Making the Same", which was itself a continuation-in-part of U.S. patent application Ser. No. 08/083,406 filed Jun. $22^{nd}$, 1993 (now abandoned) by Arthur Tauber and Steven C. Tidrow for "C-Axis Oriented High Temperature Superconductor (HTSC) on Gadolinium Gallium Garnet, GGG, Microwave Device Including the Structure and Method of Making the Structure";

GOVERNMENT INTEREST

The invention described herein may be manufactured, used, and licensed by or for the Government of the United States of America for governmental purposes without the payment to us of any royalty thereon.

FIELD OF INVENTION

The invention relates in general to a method of depositing c-axis oriented epitaxial high critical temperature superconductors (HTSCs) onto new compositions of garnets, to the structure so made, and to a microwave device including the structure.

BACKGROUND OF THE INVENTION

Since the discovery of HTSCs, for example $YBa_2Cu_3O_{7-x}$ commonly known as Y-123, there has been a search for appropriate materials on which to grow HTSC thin film devices. Due to the chemical composition, crystal structure and anisotropic super-conducting properties of HTSCs, the material used for thin film growth must be chemically compatible, match the HTSCs in temperature expansion coefficient and lattice parameter, exhibit low defect density and be mechanically strong. Epitaxial HTSC films deposited on such materials possess the best superconducting properties. For most device applications, the HTSC is deposited with the c-axis normal to the substrate surface since these fully oxygenated films possess the highest critical temperature ($T_c$), smallest transition width ($\Delta T_c$), largest critical current density ($J_c$) and lowest surface resistance ($R_s$). For microwave device applications requiring fast propagation and/or larger features, the material on which HTSC films are grown must be low loss, have a low dielectric constant and preferably be isotropic with respect to the microwave radiation.

Because garnets have reasonably low dielectric constants of $\epsilon$ from 9–13, reasonably low dielectric loss of $10^-$, temperature expansion coefficients comparable to those of Y123, and are low cost substrates, they have been suggested as potential substrate materials for the fabrication of HTSC microwave devices.

SUMMARY OF THE INVENTION

The general object of this invention is to provide a method of growing superior microwave devices and devices made by that method. A more particular object of the invention is to provide such a method wherein c-axis microwave device quality HTSC films are deposited on crystallographically preferred orientations of single crystals of new garnet composition.

It has now been found that the aforementioned objects can be attained by depositing a Y-123 layer on a MgO substrate. This Y-123 film is c-axis oriented. A $Y_3(Y_{0.505}Ga_{1.495})Ga_3O_{12}$ layer having an orientation of (422)(211), (400) (100), (220) (440) or (420) (210) is then deposited on the Y-123 film. Finally, a second Y-123 layer is deposited atop the $Y_3(Y_{0.505}Ga_{1.495})Ga_3O_{12}$ layer forming a Y-123/GGG/Y-123 trilayer structure on the MgO substrate. This last deposited Y-123 layer also adopts a c-axis orientation providing excellent lattice matching between these last two layers, those layers becoming the operative portion of the microwave device. By a new garnet composition is meant a garnet that has not previously been reported to be lattice matched to a HTSC and not disclosed in Ser. No. 08/228,788 (U.S. Pat. No. 5,418,215). These new garnet compositions are selected from the group consisting of $Re_3M_2N_3O_{12}$ where Re is Gd, Lu or Y and where M is Sc or In, and where N is Ga or Al; $Ca_3MNGeO_{12}$ where M is Ti or Zr, or Ge and where N is Mg or Ca; $Na_2CaZr_2Ge_{O12}$ $Ca_3MNGa_3O_{12}$ where M is Nb, N is Zr or Hf or Sn; $Ca_3Sn_3Ga_2O_{12}$; $NaCa_2Sb_2Ga_3O_{12}$ $Ca_3Sn_3Ga_2O_{12}$; $Ca_2LaZr_2Ga_3O_{12}$; $(Ca_{2.5}M_{0.5})M_2Ga_3O_{12}$ where M is Zr or Hf; $Y_{3-x}Ca_xTi_xGa_{5-x}O_{12}$ where $0 \leq x \leq 3$; $(Y_{3-x-y}Ca_{x+y})Zr_yTi_xGa_{5-x-y}O_{12}$ where $0 \leq x+y \leq 3$; $Y_3(Y_{0.505}Ga_{1.495})Ga_3O_{12}$; $Y_3(In_{0.6}Ga_{1.4})Ga_3O_{12}$; and $(Y_{1.05}Ca_{1.95})Ti_{1.95}Ga_{3.05}O_{12}$; using pulsed layer deposition with conditions of about 1 to about 100 mTorr of oxygen partial pressure, a block temperature of about 690° C. to about 770° C., a laser fluence of about 1 to about 2 Joules/cm² at the target at a laser repetition rate of about one to about 15 Hz and a target to substrate distance of about 7 cm and in which the a and b lattice parameters of the garnet exhibit a mismatch of less than about 7 percent with the a and b lattice parameters of the high critical temperature superconductors.

DESCRIPTION OF THE PREFERRED EMBODIMENT

In the preferred embodiment of the invention, Y-123 is deposited onto a (100) MgO substrate using a pulsed laser deposition (PLD) technique. A layer of a new garnet composition layer is then grown by PLD from a $Y_3(Y_{0.505}Ga_{1.495})Ga_3O_{12}$ target on the resulting c-axis oriented Y-123 film on the MgO substrate. A subsequent Y-123 layer is then deposited on the $Y_3(Y_{0.505}Ga_{1.495})Ga_3O_{12}$ layer. The resulting trilayer structure (Y-123/$Y_3(Y_{0.505})$ $Ga_3O_{12}$/Y-123 on the MgO substrate) has been investigated by x-ray diffractometry. The diffraction peaks from the trilayer structure were identified as c-axis Y-123 as evidenced by the presence of sharp, intense (001) reflections on several orientations of the $Y_3(Y_{0.505}Ga_{1.495})Ga_3O_{12}$ [(440) (220), (100) (400), (210) (420), (211) (422)] layer on a c-axis Y-123 on (001) oriented MgO substrate.

The preferred growth conditions (block temperature of 730° C. and oxygen pressure 85 mTorr) differ drastically not only from the conditions used for optimal growth (850° C., 175 mTorr) of Y-123 on $LaAlO_3$ at this laboratory but also from those described in the literature for c-axis growth of Y-123 on commonly used substrates like $LaAlO_3$ by PLD.

Since $Y_3(Y_{0.505}Ga_{1.495})Ga_3O_{12}$ has a structural lattice match and chemical compatibility with the HTSCs (specifically copper oxide superconductors such as. $Tl_2Ca_2Ba_2Cu_3O_{10}, T_1Ca_2Ba_2Cu_3O_9, T_{11}Ca_2Ba_2Cu_3O_8$, and $REBa_2Cu_3O_{7-x}$ where RE is an element selected from the group consisting of Nd, Sm, Eu, Gd, Dy, Ho, Er, Tm, Yb and Lu), it should be possible to grow $Y_3(Y_{0.505}Ga_{1.495})Ga_3O_{12}$ and other new garnet composition buffer layers on materials/substrates that lattice match the HTSCs such that c-axis HTSC films are obtained. In fact, it has been demonstrated that epitaxial $Y_3(Y_{0.505}Ga_{1.495})Ga_3O_{12}$ films that exhibit (422)(211), (210)(420), (400)(100) and (220)(440) orientation can be grown on MgO, NdGaO$_3$, SrTiO$_3$, LaAlO$_3$, and Sr$_2$AlTaO$_6$.

More particularly, according to this invention, c-axis oriented HTSCs are deposited on crystallographically preferred orientations of single crystals of new garnet compositions using a pulsed laser deposition technique (PLD), with conditions of about 1 to about 110 mTorr of oxygen partial pressure, a block temperature of about 690° to about 770° C., a substrate surface temperature of about 730° to about 830° C. and a laser fluence of 1 to 2 Joules/cm$^2$ at the target, a laser repetition rate of about 1 to 15 Hz and a target to substrate distance of 7 cm and in which the a and b lattice parameters of the $Y_3(Y_{0.505}Ga_{1.495})Ga_3O_{12}$ exhibit an effective lattice mismatch of less than 4.0 percent with the a and b lattice parameters of the HTSC.

Preferred in the foregoing deposition is the use of about 85 millitorr of oxygen, a block temperature of about 730° C., a laser fluence of 1 to 2 Joules/cm$^2$, a laser repetition rate of about 1 to 15 Hz and a mismatch of less than 4 percent.

A $Y_3(Y_{0.505}Ga_{1.495})Ga_3O_{12}$ single crystal substrate that has been found particularly useful has the very specific orientation, (422) or equivalently (211). That is, the (422) plane in single crystal $Y_3(Y_{0.505}Ga_{1.495})Ga_3O_{12}$ gives the best fit or match to the a b axis in the HTSC. Other orientations that provide a relatively good lattice match of a and b parameters to those of a c-axis oriented HTSC such as Y-123 and that can be used in the invention include (400) (100), (220)(440), and (420)(210) orientations of $Y_3(Y_{0.505}Ga_{1.495})Ga_3O_{12}$.

Superior multilayer structures can be made by starting with a single crystal $Y_3(Y_{0.505}Ga_{1.495})Ga_3O_{12}$ substrate. Because the first HTSC layer deposited on the $Y_3(Y_{0.505}Ga_{1.495})Ga_3O_{12}$ substrate is highly c-axis oriented, a subsequent thin film buffer layer of $Y_3(Y_{0.505}Ga_{1.495})Ga_3O_{12}$ grows epitaxially on the HTSC. A subsequent thin film of HTSC can be grown on the GGG buffer layer. The end result is a multilayered structure having superior microwave properties.

While the $Y_3(Y_{0.505}Ga1.495)Ga_3O_{12}$ portion of the trilayer is predominantly (422) or equivalently (211) oriented, other orientations are present (220), (400), and (420) that are equivalently (110), (100) and (210) oriented, respectively. The possible growth direction of Y-123 on the various orientation of $Y_3(Y_{0.505}Ga_{1.495})Ga_3O_{12}$ are then investigated (by modeling) to see if appropriate lattice matching occurs. Modeling shows that the lattice mismatch is less than 4% for all four orientations.

Since the lattice match is so good (typically below 4% lattice mismatch of the a and b axis of Y-123), c-axis oriented growth can be attained on these planes. Other planes have been investigated by simulation and do not lattice match the Y-123 as well. No other planes of $Y_3(Y_{0.505}Ga_{1.495})Ga_3O_{12}$ will support high quality c-axis growth of Y-123; otherwise, other orientations of $Y_3(Y_{0.505}Ga_{1.495})Ga_3O_{12}$ would be observed to grow on the c-axis oriented Y-123 on MgO.

In lieu of Y-123 other HTSCs that can be used in the invention include $Tl_2Ca_2Ba_2Cu_3O_{10}$, $Tl_1Ca_2Ba_2Cu_3O_9$, $Tl_2Ba_2Ca_1Cu_2O_8$ and $REBa_2Cu_3O_{7-x}$ where RE is an element taken from the group of elements Y, Nd, Sm, Eu, Gd, Dy, Ho, Er, Tin, Yb and Lu.

Compounds that can be synthesized with the garnet structure range in lattice parameter from 11.30 to 12.76 Å. Within this range the effective lattice mismatch on garnet (211) (422), (440) (220), (400) (100) and (420) (210) planes to c-axis growth of YBCO is less than 7% and may be as small as 0%. The mismatch between c-axis oriented Y-123 grown on (100) MgO is about 7%.

We wish it to be understood that we do not desire to be limited to the exact details of construction shown and described for obvious modifications will occur to a person skilled in the art.

What is claimed is:

1. A composite comprising a layer of a c-axis oriented copper oxide superconductor grown on a garnet substrate, wherein said substrate is chemically compatible with said copper oxide superconductor and has an orientation selected from the group consisting of (211)(422), (220)(440) and (420)(210), further wherein said substrate's thermal expansion coefficient substantially matches the copper oxide superconductor's thermal expansion coefficient, and further wherein the substrate has a mismatch of less than 4 percent with the a and b lattice parameters of the copper oxide superconductor, and wherein the substrate has a low defect density and is mechanically strong, the garnet substrate is selected from the group consisting of $RE_3M_2N_3O_{12}$ where RE is Gd, Lu, or Y and where M is Sc or In, and N is Ga or Al; $Ca_3MNGe_3O_{12}$ where M is Ti, Zr, or Ge and where N is Mg or Ca; $Na_2CaZr_2Ge_3O_{12}$; $Ca_3MNGa_3O_{12}$ where M is Nb, N is Zr, Hf or Sn; $Ca_3Sn_3Ga_2O_{12}$; $NaCa_2Sb_2Ga_3O_{12}$; $Ca_2LaZr_2Ga_3O_{12}$; $(Ca_{2.5}M_{0.5})M_2Ga_3O_{12}$ where M is Zr or Hf; $Y_{3-x}Ca_xTi_xGa_{5-x}O_{12}$ where $0 \leq x \leq 3$; $(Y_{3-x-y}Ca_{x+y})Zr_yTi_xGa_{5-x-y}O_{12}$ where $0 \leq x+y \leq 3$; $Y_3(Y_{0.505}Ga_{1.495})Ga_3O_{12}$; $Y_3(In_{0.6}Ga_{1.4})Ga_3O_{12}$; and $(Y_{1.05}Ca_{1.95})Ti_{1.95}Ga_{3.05}O_{12}$.

* * * * *